(12) United States Patent
Qi

(10) Patent No.: US 10,948,542 B2
(45) Date of Patent: Mar. 16, 2021

(54) METHOD AND APPARATUS TO DETECT AND ISOLATE FAULTS IN ROTARY MACHINES

(71) Applicant: Xiaoyuan Qi, Rexford, NY (US)

(72) Inventor: Xiaoyuan Qi, Rexford, NY (US)

(73) Assignee: QSD Solutions LLC, Rexford, NY (US)

( * ) Notice: Subject to any disclaimer, the term of this patent is extended or adjusted under 35 U.S.C. 154(b) by 139 days.

(21) Appl. No.: 16/446,597

(22) Filed: Jun. 19, 2019

(65) Prior Publication Data

US 2020/0400745 A1    Dec. 24, 2020

(51) Int. Cl.
*G01R 31/34* (2020.01)
*G01R 25/00* (2006.01)
*G01R 23/16* (2006.01)

(52) U.S. Cl.
CPC ........ *G01R 31/346* (2013.01); *G01R 23/16* (2013.01); *G01R 25/00* (2013.01)

(58) Field of Classification Search
CPC ....... G01R 31/346; G01R 25/00; G01R 23/16
USPC .......................................... 324/500, 511, 512
See application file for complete search history.

(56) References Cited

U.S. PATENT DOCUMENTS

| | | | | |
|---|---|---|---|---|
| 2015/0097594 A1* | 4/2015 | Graber | .................... | G05B 9/02 324/764.01 |
| 2015/0276843 A1* | 10/2015 | Temme | .................. | H05B 6/067 373/145 |
| 2016/0025792 A1* | 1/2016 | Oestreicher | ............ | G05B 15/00 324/538 |
| 2016/0054370 A1* | 2/2016 | Fomin | .................. | G01R 31/312 324/509 |
| 2016/0061872 A1* | 3/2016 | Kinsella | ................. | G01R 31/50 324/509 |
| 2019/0146022 A1* | 5/2019 | Kinsella | ................. | G01R 31/42 324/509 |

* cited by examiner

*Primary Examiner* — Giovanni Astacio-Oquendo

(57) ABSTRACT

A method and an apparatus are disclosed to detect and isolate faults in a rotary machine having a rotor and at least two stator windings. The method comprises generating an input signal and applying the input signal to a set of stator windings while the rotor is locked at a rotor position, measuring output signals and processing the output signals by Fourier transform to obtain a frequency response, testing the rotary machine at discrete rotor positions to obtain a frequency response function of the rotor position, applying Fourier transform to the frequency response function to obtain a two-dimension frequency response in frequency and spatial frequency domain, comparing the two-dimension frequency response with a reference, determining that there is a fault in the rotary machine if the difference exceeds a threshold number. The apparatus is designed to test a rotary machine using the inventive method.

8 Claims, 6 Drawing Sheets

METHOD AND APPARATUS TO DETECT AND ISOLATE FAULTS IN ROTARY MACHINES

FIELD OF THE INVENTION

The present invention relates to a method and apparatus to detect and isolate faults in a rotary machine, specifically an electric rotary machine with a rotor and at least two stators.

BACKGROUND ART

An electric rotary machine can be an electric motor or a generator.

Electric motors are widely used in both industrial and consumer products such as pumps, compressors and fans. It is important to identify and isolate any potential faults in an electric motor and maintain it in good health. The failure modes of an electric motor include stator turn-turn short, broken stator windings, stator-frame insulation breakdown, deteriorated rotor eccentricity, broken rotor bars, rotor bar-bar short, shifted shaft, and bearing defects.

Fault detection techniques of a rotary machine mainly fall into two categories, online test and offline test. Online test is to measure dynamics of a rotary machine while the rotary machine is in operation. Online test typically requires various types of sensors and the output is also vulnerable to noise. Additionally, online test equipment is bulky and expensive. Offline test is to measure statics of a rotary machine and it is more immune to noise. Offline tests can be low voltage, medium voltage or high voltage test. High-voltage offline test can potentially deteriorate the rotary machine. Low-voltage or medium-voltage offline test is less invasive and safe to perform, which is especially preferred in a harsh industrial environment. In addition, low-voltage or medium-voltage test equipment is easy to carry and less expensive.

One offline test for an electric motor, according to the prior art, is to collect stator winding inductance measurements by applying a sinusoidal signal to the stator winding while the rotor is being rotated at a constant speed or at discrete steps. An inductance waveform versus rotor position or time is generated. This inductance waveform is compared to that measured on a healthy motor. Any significant deviation from the healthy motor waveform is an indication of a motor fault. There are also a few variants of this test method based on the same principle in the prior art. However, there are several disadvantages of this method. It is a space-domain or time-domain based analysis and is susceptible to noise. As a result, it requires a higher threshold and lowers the sensitivity. In addition, some signals in the measurement data such as low magnitude high-frequency signals are not obvious and ignored, which also reduces the sensitivity. Furthermore, the judgment is often subjective, which results in erroneous conclusions and false alarms.

U.S. Pat. No. 10,107,861 B1 discloses a method to detect faults in a rotary machine based on frequency responses. In the disclosure, the frequency responses of the stator windings are measured while the rotor is locked at a rotor position. Derived quantities are formed from the frequency responses to be independent of the rotor position. These derived quantities are compared with the corresponding reference quantities. If the difference between them is above a set threshold, it indicates a fault in the rotary machine. The reference quantities can be the derived quantities obtained at a different rotor position, or the derived quantities obtained on the same rotary machine in a different time period, or the derived quantities obtained on a healthy rotary machine. This method removes the rotor position dependency in the test and significantly simplifies the test. It does not require continuous rotor rotation during the test. Additionally, it is a frequency-domain analysis and is less affected by noise.

When a fault is detected by performing the method disclosed in U.S. Pat. No. 10,107,861 B1, it is not always easy to isolate what type of faults in the rotary machine. Additional tests may be needed to isolate the faults. Fault isolation is important to find the failing part and have the rotary machine repaired quickly. Thus, there remains a considerable need for methods and apparatus that can reliably and conveniently isolate faults in a rotary machine.

SUMMARY OF THE INVENTION

A primary object of the present invention is to provide an improved method over the prior art to reliably detect and isolate faults in an electric rotary machine, improve the sensitivity and avoid false alarms.

Another object of the present invention is to provide a convenient apparatus to implement the inventive method.

In a first aspect of the invention, a method to detect and isolate faults in a rotary machine having a rotor and at least two stator windings is provided. The method comprises the following steps:

generating an input signal and applying the input signal to a stator winding or a set of stator windings of the rotary machine while the rotor is locked at a rotor position, measuring output signals from the stator winding or the set of stator windings while the rotor is locked at the rotor position, processing the output signals to obtain a frequency response of the stator winding or the set of stator windings at the rotor position, rotating the rotor to a new rotor position by a rotation angle and locking the rotor at the new rotor position, repeating the previous steps to obtain a new frequency response at the new rotor position, keeping rotating the rotor at discrete steps and collecting the frequency responses till the rotor is rotated for at least a complete cycle to obtain a frequency response function of the rotation angle, applying Fourier transform to the frequency response function to obtain a two-dimension frequency response in terms of a frequency and a spatial frequency, comparing a magnitude or a phase difference between the two-dimension frequency response and a reference two-dimension frequency response, determining that there is a fault in the rotary machine if the magnitude or the phase difference exceeds a threshold number, repeating the above method for all stator windings or all sets of stator windings.

The input signal comprises an arbitrary waveform including a sweeping frequency waveform, an impulse waveform, a maximum length binary sequence (MLBS) waveform and other wideband waveforms.

The rotation angle is equal to or less than 90/p degrees to avoid aliasing, wherein p represents the number of pole pairs.

The reference two-dimension frequency response can be obtained on another stator winding or another set of stator windings.

The reference two-dimension frequency response can be obtained on the rotary machine in a different time period.

The reference two-dimension frequency response can be obtained on a healthy rotary machine of the same model by following the same method.

An advantage of the inventive method is that the fault detection and isolation sensitivity is significantly improved by comparing the spectra in the frequency and spatial frequency domain. Low-magnitude signals at different frequencies may be indistinguishable in the time or space domain, but are evident in the frequency domain.

Furthermore, the fault detection and isolation using the frequency analysis is less affected by noise and the false alarms can be avoided. For example, one common noise in the fault detection and isolation test is the 50 Hz or 60 Hz noise from power lines. This noise can be easily filtered in the frequency domain, whereas it affects the waveforms in the time or space domain and can cause false alarms.

Additionally, the two-dimension frequency response is a signature of the rotary machine and different frequency responses can be mapped to different types of faults. Thus, the fault isolation can be more reliably and effectively achieved.

Therefore, the above described method can improve sensitivity, reduce noise, avoid false alarms and more reliably detect and isolate faults.

In a second aspect of the invention, an apparatus to detect faults in a rotary machine having a rotor and at least two stator windings is provided. The apparatus comprises at least a signal generator, an ADC, and a computing and control unit to perform the following functions:

generating an input signal and applying the input signal to a stator winding or a set of stator windings of the rotary machine while the rotor is locked at a rotor position, measuring output signals from the stator winding or the set of stator windings while the rotor is locked at the rotor position, processing the output signals to obtain a frequency response of the stator winding or the set of stator windings at the rotor position, rotating the rotor to a new rotor position by a rotation angle and locking the rotor at the new rotor position, repeating the previous steps to obtain a new frequency response at the new rotor position, keeping rotating the rotor at discrete steps and collecting the frequency responses till the rotor is rotated for at least a complete cycle to obtain a frequency response function of the rotation angle, applying Fourier transform to the frequency response function to obtain a two-dimension frequency response in terms of a frequency and a spatial frequency, comparing a magnitude or a phase difference between the two-dimension frequency response and a reference two-dimension frequency response, determining that there is a fault in the rotary machine if the magnitude or the phase difference exceeds a threshold number, repeating the above test and analysis for all stator windings or all sets of stator windings.

The input signal comprises an arbitrary waveform including a sweeping frequency waveform, an impulse waveform, a maximum length binary sequence (MLBS) waveform and other wideband waveforms.

The rotation angle is equal to or less than 90/p degrees to avoid aliasing, wherein p represents the number of pole pairs.

The reference two-dimension frequency response can be obtained on another stator winding or another set of stator windings.

The reference two-dimension frequency response can be obtained on the rotary machine in a different time period.

The reference two-dimension frequency response can be obtained on a healthy rotary machine of the same model by following the same method.

An advantage of the inventive apparatus is that the fault detection and isolation sensitivity is significantly improved by comparing the spectra in the frequency and spatial frequency domain. Low-magnitude signals at different frequencies may be indistinguishable in the time or space domain, but are evident in the frequency domain.

Furthermore, the fault detection and isolation using the frequency analysis is less affected by noise and the false alarms can be avoided. For example, one common noise in the fault detection and isolation test is the 50 Hz or 60 Hz noise from power lines. This noise can be easily filtered in the frequency domain, whereas it affects the waveforms in the time or space domain and can cause false alarms.

Additionally, the two-dimension frequency response is a signature of the rotary machine and different frequency responses can be mapped to different types of faults. Thus, the fault isolation can be more reliably and effectively achieved.

Therefore, the above described apparatus can improve sensitivity, reduce noise, avoid false alarms and more reliably detect and isolate faults.

Numerous features, aspects, and advantages of the present invention will become more apparent from the following detailed description of a preferred embodiment of the invention, along with the accompanying drawing.

BRIEF DESCRIPTION OF THE DRAWING

To facilitate understanding embodiments of the present invention, reference is now made to the following exemplary drawing and descriptions that are not limiting the embodiments of the present invention.

DESCRIPTION OF THE PREFERRED EMBODIMENT

In order to explain the invention, a three-phase squirrel-cage induction motor has been selected to be the device under test (DUT). However, in the contemplated embodiments DUT can be any poly-phase motor or generator with a rotor and at least two stators.

Figure 1:
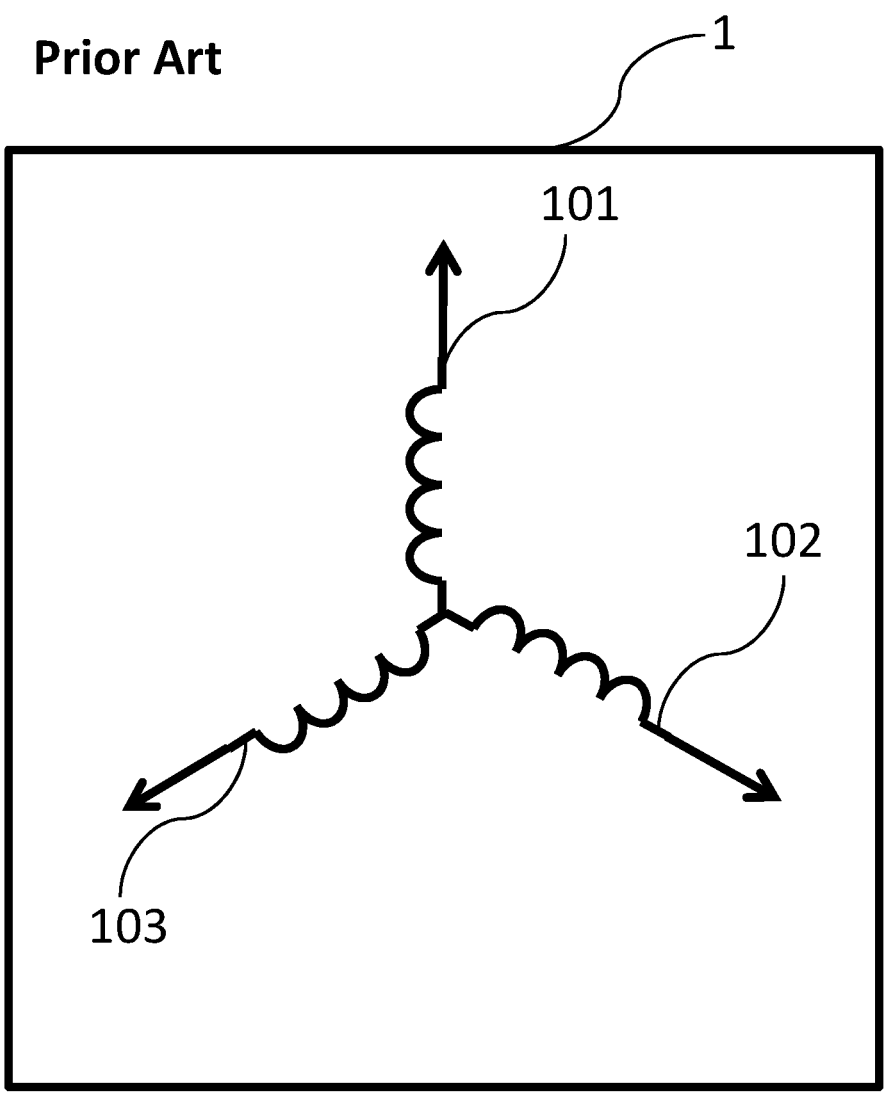
FIG. 1 shows a stator winding model of a three-phase induction motor.
Figure 2:
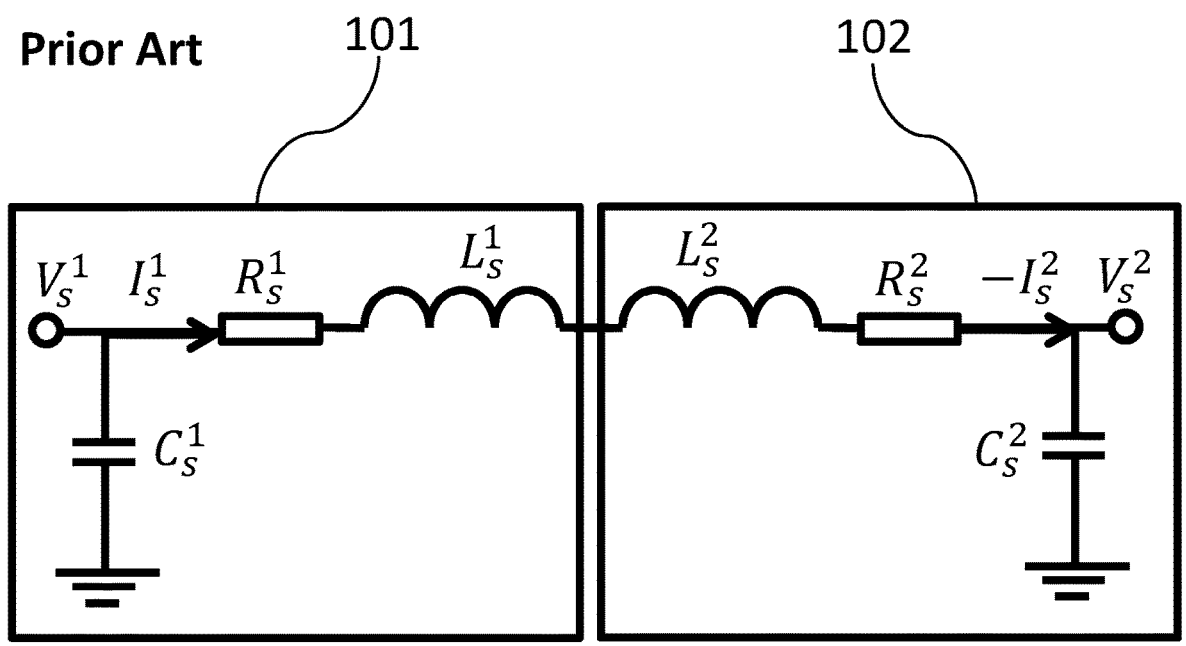
FIG. 2 shows an equivalent circuit of a pair of stator windings in a three-phase induction motor.

FIG. 1 shows a mathematical model 1 of the stator windings in a three-phase induction motor, where 101, 102, and 103 are stator windings and the arrows represent the magnetic axes. A three-phase induction motor with a delta connection can be easily tested by applying an input signal to a stator winding and measuring the induced current flowing through the stator winding and the voltage across the stator winding. A three-phase induction motor with a star connection can be tested by applying an input signal to a stator winding and measuring the induced current from another stator winding and the voltage across the two stator windings, which is shown in FIG. 2 by an equivalent circuit. A three-phase induction motor with a star connection will be further discussed below and the method can be readily applied to a three-phase induction motor with a delta connection.

FIG. 2 shows the equivalent circuit when the stator frame is grounded. An input signal is applied to the stator winding 101, the output current is measured from the stator winding 102 and the voltage is measured between the stator winding 101 and 102. However, it is contemplated that there are many other configurations to test the three-phase induction motor, for example, one output signal can be the induced voltage on the stator winding 103. In FIG. 2 $R_s^1$ is the resistance of the stator winding 101 and $R_s^2$ is the resistance of the stator winding 102. $L_s^1$ is the total inductance of the stator winding 101 and $L_s^2$ is the total inductance of the stator winding 102, and $C_s^1$ is the stator winding-frame capacitance of the stator winding 101 and $C_s^2$ is the stator winding-frame capacitance of the stator winding 102. In a healthy motor, $R_s^1=R_s^2=R_s$, $L_s^1=L_s^2=L_s$ and $C_s^1=C_s^2=C_s$. The current of the stator winding 101 is related to the current of the stator winding 102 by $I_s^1=-I_s^2$ and the voltage between the stator winding 101 and 102 is equal to $V_s^1-V_s^2$.

The stator winding-frame capacitance is the dominant capacitance among all stator capacitances. Furthermore, the stator winding-frame capacitance is independent of the rotor position. Additionally, the stator winding-frame capacitance can be measured separately by applying an input signal between the stator winding and the stator frame, which is well known from the prior art. Thus, the stator winding-frame capacitor can be treated separately from the total inductance and resistance.

The total inductance of a stator winding includes self-inductance of the stator winding, mutual inductance between the stator winding and other stator windings, and mutual inductance between the stator winding and the rotor.

According to the three-phase induction motor model in FIG. 1 and FIG. 2, and Kirchhoff's law, $$V_s = I_s R_s + \frac{d\emptyset_s}{dt}$$

$$V_s = \begin{pmatrix} V_s^1 \\ V_s^2 \\ V_s^3 \end{pmatrix} I_s = \begin{pmatrix} I_s^1 \\ I_s^2 \\ I_s^3 \end{pmatrix}$$

where $V_s$ is the voltage vector of the stator windings, $I_s$ is the current vector of the stator windings, $\emptyset_s$ is the magnetic flux vector of the stator windings. The stator winding resistor matrix is $$R_s = \begin{pmatrix} R_s & 0 & 0 \\ 0 & R_s & 0 \\ 0 & 0 & R_s \end{pmatrix}.$$

The stator self-inductance matrix is $$L_s = \begin{pmatrix} L_{ms}+L_{ls} & -\frac{1}{2}L_{ms} & -\frac{1}{2}L_{ms} \\ -\frac{1}{2}L_{ms} & L_{ms}+L_{ls} & -\frac{1}{2}L_{ms} \\ -\frac{1}{2}L_{ms} & -\frac{1}{2}L_{ms} & L_{ms}+l_{ls} \end{pmatrix}$$

where $L_{ms}$ is the magnetizing inductance of a stator winding and $L_{ls}$ is the leakage inductance of a stator winding.

Assume the reflected magnetic flux from the rotor is $\emptyset_r$, we have $$\emptyset_s = L_s I_s + \emptyset_r.$$

For a squirrel-cage induction motor, $\emptyset_r$ has two components. One component is the reflected magnetic flux $\emptyset_{rI}$ from the induced bar current. The other component is the reflected magnetic flux $\emptyset_{rr}$ due to the residual flux in the rotor.

Furthermore, for a perfect squirrel cage. $\emptyset_{rI}$ is independent of the rotor position. This can be assumed for a typical squirrel-cage induction motor. $\emptyset_{rr}$ depends on the rotor position because the residual flux can be along or opposite to the excitation flux from the stator.

Figure 3:
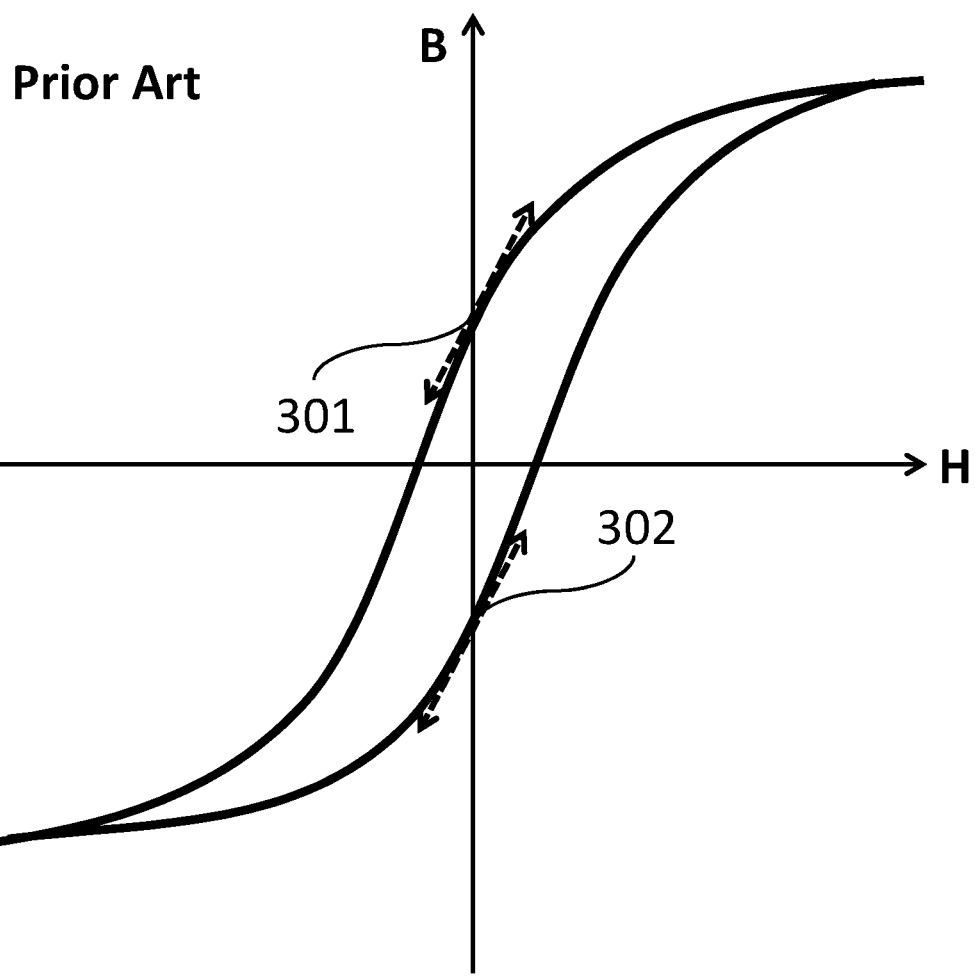
FIG. 3 shows a B-H (magnetic flux density B vs. magnetic field strength H) hysteresis loop of the rotor in a squirrel-cage induction motor.

FIG. 3 illustrates a B-H (magnetic flux density B vs. magnetic field strength H) hysteresis loop of the rotor, where the residual flux density 301 and 302 at H=0 have an equal magnitude but opposite directions. The rotor materials are soft magnetic materials such as steel and can be easily magnetized during motor operation. If a normal motor shut-down procedure is followed, the residual flux density in the rotor will be equal to the residual flux density 301 or 302 after the motor is shut down. During the test according to the invention, the rotor flux density will vary around the residual flux density due to the low stator magnetic field strength, and form a minor loop, which can be approximated by a linear relationship indicated by dashed arrows in FIG. 3.

Figure 4:
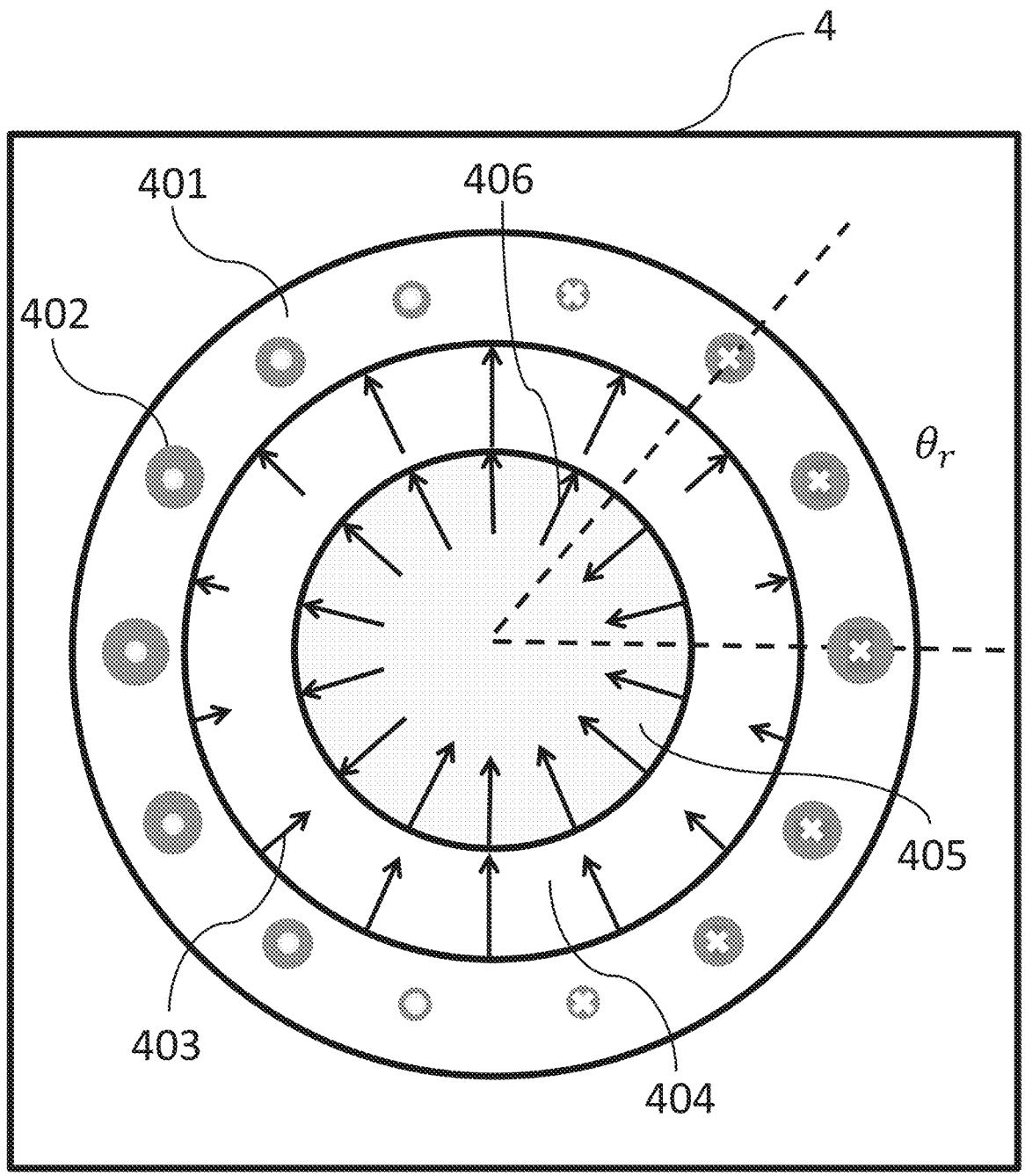
FIG. 4 shows a magnetic flux distribution in a 2-pole squirrel-cage induction motor.

Referring to FIG. 4, a magnetic flux distribution of a single phase in a 2-pole squirrel-cage induction motor 4 is shown. The motor 4 has a stator 401, an air gap 404 and a rotor 405. A current flow 402 in a single phase winding of the stator 401 is shown in FIG. 4. The stator phase winding has a magnetic field strength 403, which follows a sinusoidal distribution in the air gap 404. The rotor 405 has a residual magnetic field strength 406 with a constant magnitude and varying directions depending on the poles of the motor if a normal motor shut-down procedure is followed. If the residual flux and the excitation flux are aligned, the misalignment angle is set to 0 degree. The misalignment angle is indicated by $\theta_r$ in FIG. 4. It is noted that the misalignment does not have to start at 0 degree in the coordinate system in FIG. 4.

Although a normal motor shut-down procedure is assumed herein, it is contemplated that there are many other ways to precondition the rotor to have a known residual flux distribution before the test is performed.

During each test, one stator winding is always open without current flowing, for example the stator winding 103 in the test configuration of FIG. 2. Thus, the Kirchhoff equation for the stator winding 103 can be removed while the stator winding 101 and 102 are being tested.

From the preceding equations, $V_s^{12}$ can be expressed in the following equation via Laplace transform, $$V_s^{12} = (2R_s + 3sL_{ms} + 2sL_{ls})I_1^s + sL_{ri}^{eq}I_1^s + V_{rr}$$

where s is the complex variable in Laplace transform, $L_{ri}^{eq}$ is the equivalent inductance due to the induced rotor bar current and does not depend on the rotor position, and $V_{rr}$ is the back electromotive force (EMF) due to the interaction between the excitation flux and the rotor residual flux.

The back EMF $V_{rr}$ for the stator winding 101 and 102 in the 2-pole three-phase induction motor can be derived using the magnetic field strength distribution in FIG. 4, $$V_{rr} = sA_s I_1^s \left( -\frac{\pi}{3} - \frac{\cos(2\theta_r + \frac{\pi}{6})}{2} \right)$$

where $A_s$ is a constant determined by the characteristic of the motor. Thus, $$V_s^{12} = I_1^s(2R_s + 3sL_{ms} + 2sL_{ls}) + sL_{rl}^{eq} I_1^s + sA_s I_1^s \left( -\frac{\pi}{3} - \frac{\cos(2\theta_r + \frac{\pi}{6})}{2} \right).$$

The above equation can be easily transformed into frequency domain by s=jω.

A frequency response of the system can be defined as the voltage across the tested stator windings divided by the current through the stator windings in the frequency domain, $$H_s^{12}(\omega) =$$

$$\frac{V_s^{12}}{I_s^1} = (2R_s + 3j\omega L_{ms} + 2j\omega L_{ls}) + j\omega L_{rl}^{eq} + j\omega A_s \left( -\frac{\pi}{3} - \frac{\cos(2\theta_r + \frac{\pi}{6})}{2} \right).$$

The frequency response $H_s^{12}$ is a periodic function of the misalignment angle or rotor position angle $\theta_r$ and the period is 180 degrees for the 2-pole three-phase squirrel-cage induction motor.

Similarly, the frequency responses $H_s^{23}$ between the stator winding 102 and 103 and $H_s^{31}$ between the stator winding 103 and 101 can be obtained by replacing $\theta_r$ with $$\theta_r + \frac{2\pi}{3} \text{ and } \theta_r + \frac{4\pi}{3},$$

respectively. The frequency response is a characteristic quantity of both the stator and the rotor. It is also contemplated that there are many other definitions of the frequency response.

It is apparent that the frequency response depends on the rotor position angle $\theta_r$. The above frequency response is for a two-pole three-phase squirrel-cage induction motor. For a three-phase squirrel-cage induction motor with p pairs of poles, $\theta_r$ is replaced with $p\theta_r$ in the above frequency response expression.

In the following, the test method and the preferred embodiment of the apparatus will be combined to describe the invention in details.

Figure 5:
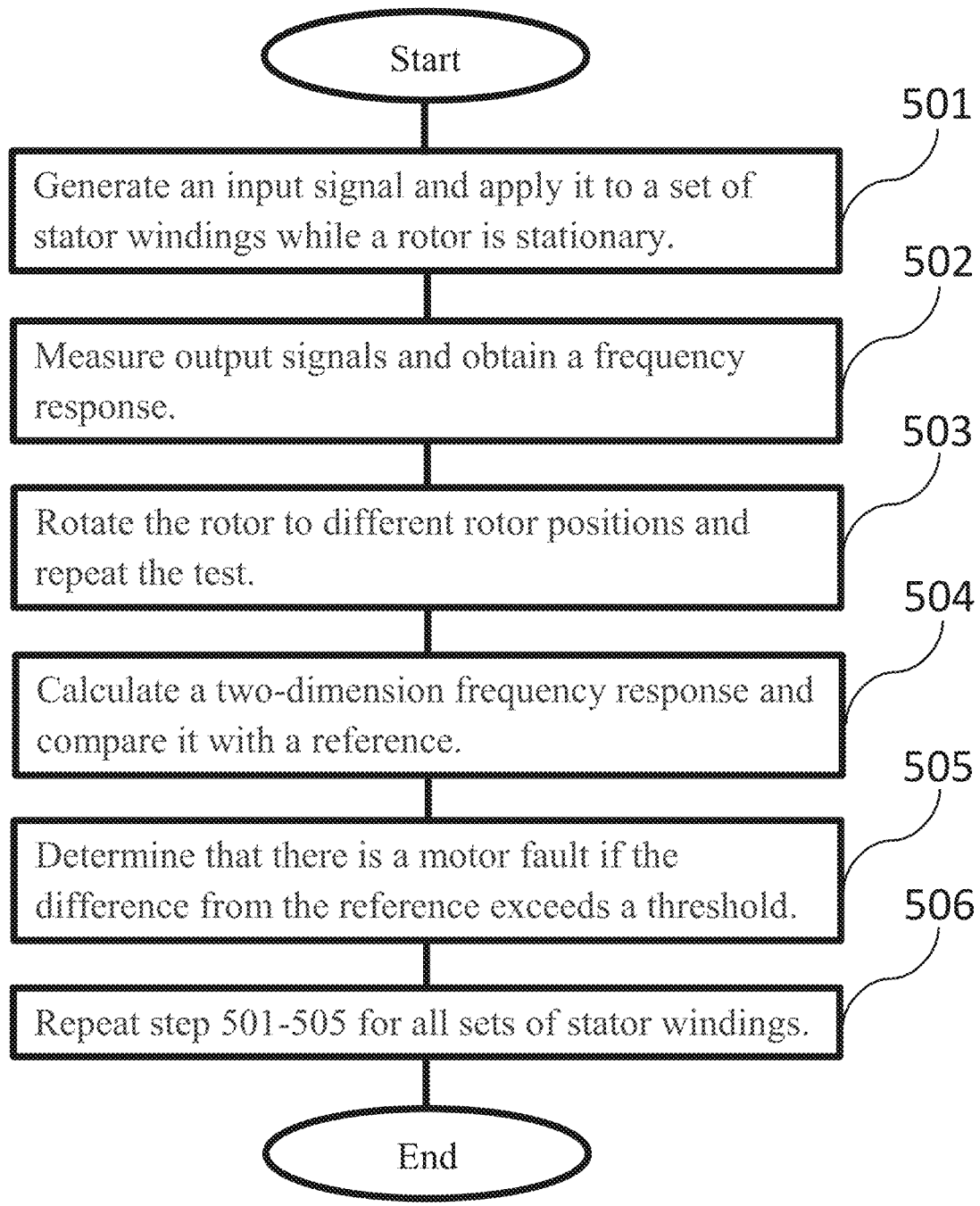
FIG. 5 shows a flow chart of a method to detect and isolate faults in a rotary machine in accordance with the invention.
Figure 6:
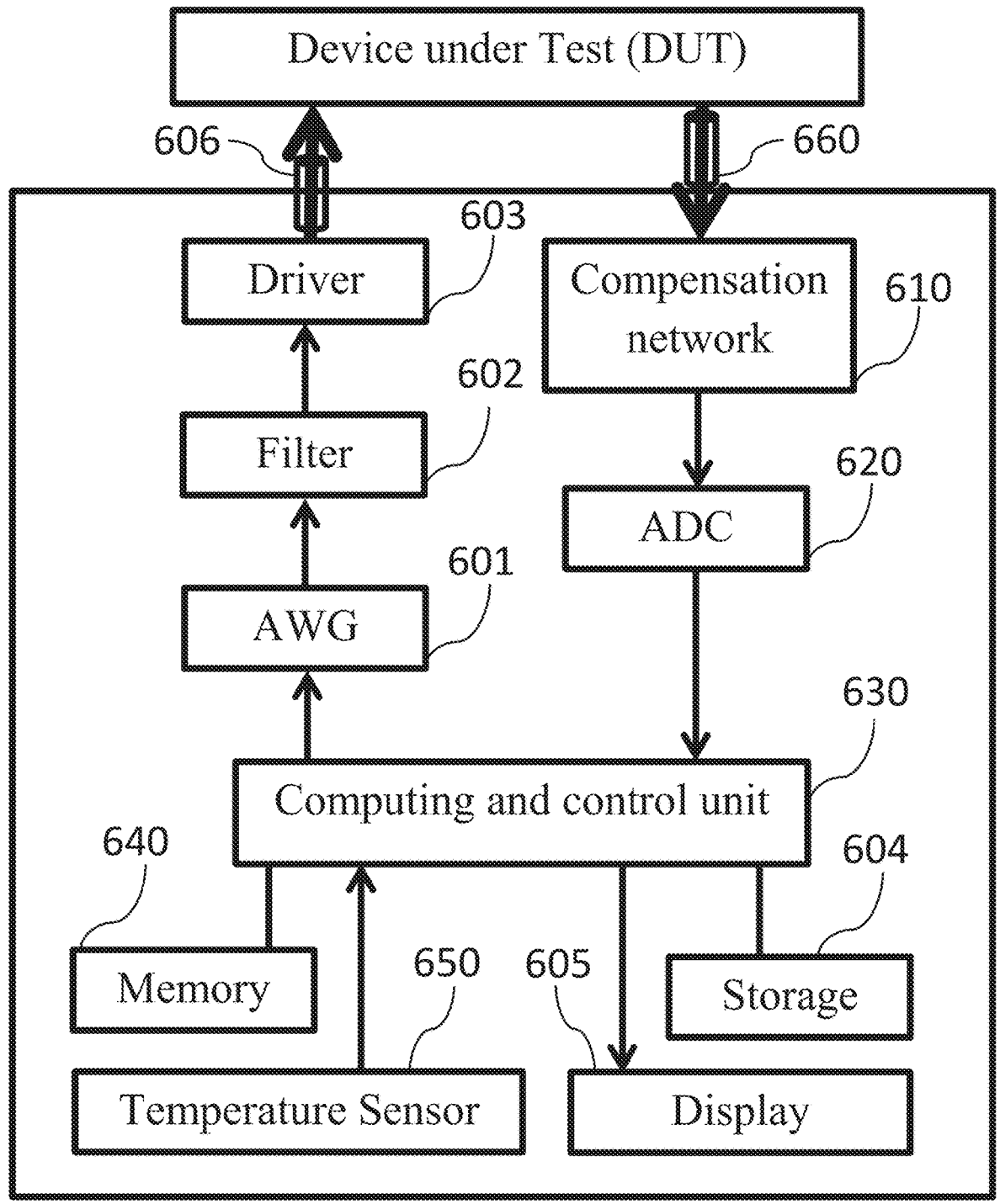
FIG. 6 shows a functional block diagram of a preferred embodiment of an apparatus in accordance with the invention.

In step 501 of FIG. 5, an input signal is generated by an arbitrary waveform generator (AWG) 601 in FIG. 6. The generated waveform is preferably a signal covering frequency range from DC to 1 MHz, including a sinusoidal waveform with a sweeping frequency from DC to 1 MHz and other wideband waveforms. The voltage of the input signal is preferably a low voltage to medium voltage signal, for example a peak-to-peak voltage of 3 volts or 5 volts. The computing and control unit 630 in FIG. 6 controls the waveform generation. The generated waveform will pass through a lowpass or bandpass filter 602 and a driver 603 in FIG. 6 to improve signal integrity and drivability. The waveform is the input signal and is applied to the stator windings preferably through a cable 606 with a shield, including a coaxial cable and a triaxial cable to reduce electromagnetic interference (EMI).

In step 502 of FIG. 5 the output signals are measured. One output signal is preferably the output current from a stator winding, for example, the output current from the stator winding 102 in FIG. 2. Another output signal is preferably the voltage across stator windings, for example the voltage across stator winding 101 and 102 in FIG. 2, i.e. $V_s^1 - V_s^2 = V_s^{12}$. In FIG. 6, a compensation network 610 is connected to the stator winding by a cable 660, which is preferably a cable with a shield. For the output current, the compensation network 610 converts the output current into an output voltage and enhances the output voltage, which comprises two stages. The first stage comprises an array of resistors and capacitors. The computing and control unit 630 dynamically selects the resistors and capacitors to optimize the output voltage level and improve the signal-to-noise ratio (SNR). One optimization method is to select the resistors and capacitors to match the DUT impedance which varies with frequency. The second stage comprises a variable-gain amplifier to amplify the output voltage signal to the desired voltage range so that the measurement accuracy is improved. The computing and control unit 630 dynamically adjust the gain in the variable-gain amplifier according to the feedback from the measurement. For the voltage across the stator windings, the compensation network 610 acts as a voltage buffer.

Next the output signals are sampled and converted into digital signals by ADC 620 in FIG. 6. The ADC preferably has a sampling rate that is equal to or greater than 4 MHz and a resolution that is equal to or better than 12 bits. The computing and control unit 630 in FIG. 6 controls the ADC 620, receives the digital output signals from ADC 620 and calculates the output current and the voltage across the stator windings.

The computing and control unit 630 in FIG. 6 computes the frequency response $H_s^{12}(\omega)$ by using the measured voltage across stator windings and the measured output current, and separating the stator winding-frame capacitor contribution. A fast Fourier transform (FFT) algorithm is used. To fulfill the computation, the computing and control unit 630 preferably comprises a 32-bit central processing unit (CPU), a floating point unit (FPU) and at least 256K SRAM. The computing and control unit 630 can be a microcontroller or a field-programmable gate array (FPGA). To further improve performance, an external memory unit 640 may be added shown in FIG. 6.

In step 503 of FIG. 5, the rotor is rotated to a new rotor position by a rotation angle Δθ and is locked at the new rotor position. The frequency response is obtained at the new rotor position by following step 501 and 502. The rotor continues to rotate to discrete angles $\theta_r = n\Delta\theta$ where n is an integer. The frequency response is obtained at each discrete angle till the rotation completes at least a full cycle. At the end of step 503, the frequency response becomes a function of the rotation angle $H_s^{12}(\omega, \theta_r)$.

In step 504 of FIG. 5, another fast Fourier transform (FFT) is applied to $H_s^{12}(\omega, \theta_r)$ with respect to the rotation angle by the computing and control unit 630 to obtain a two-dimension frequency response $h_s^{12}(\omega, k)$ where k is the spatial frequency.

The number of discrete angles for each complete rotation has to be equal or larger than 4p to avoid aliasing, where p represents the number of pole pairs. Equivalently. Δθ has to be equal or smaller than 90/p degrees. The number of discrete angles is preferably chosen to be 16p or higher for each complete rotation.

An advantage of the above-mentioned method and apparatus is that the rotation can start at any rotor position and the test does not depend on the absolute rotation angle, which simplifies the test and analysis.

The two-dimension frequency response $h_s^{12}(\omega, k)$ is compared with a reference two-dimension frequency response. The reference two-dimension frequency response can be derived using the same method and apparatus while the test is carried out on another set of windings such as the stator winding 102 and 103, or the test is carried out in a different time period on the same motor, for example right after the motor is purchased and calibrated, or the test is carried on a healthy motor of the same model. Therefore, there are multiple ways to compare the two-dimension frequency response with the reference. The reference two-dimension frequency response can be stored in an external storage 604, which is connected to the computing and control unit 630 in FIG. 6.

In step 505 of FIG. 5, a decision is made that there is a fault in the motor if the difference between $h_s^{12}(\omega, k)$ and the reference exceeds a set threshold number.

In step 506 of FIG. 5, the test is repeated for other set of stator windings by following step 501-505 to obtain $h_s^{23}(\omega, k)$ and $h_s^{31}(\omega, k)$, compare them with the reference and determine if there is a fault in the motor.

A fault can be further isolated based on the failure signature in the frequency domain. For a healthy three-phase squirrel-cage induction motor, according to the previous derived equations, the two-dimension frequency response is only non-zero at $$k = 0, \frac{\pi p}{90}$$

after a normal shutdown. If there is a short circuit in the stator winding 101, $h_s^{12}(\omega, k)$ and $h_s^{31}(\omega, k)$ will be significantly different from $h_s^{23}(\omega, k)$ across the frequency ω. If there is a broken bar in the rotor, $h_s^{12}(\omega, k)$, $h_s^{23}(\omega, k)$ and $h_s^{31}(\omega, k)$ will be all significantly different from the previous recorded spectra or from the two-dimension frequency responses on a healthy motor of the same model across the frequency ω. If there is a rotor eccentricity problem, an extra frequency component will show up at a lower spatial frequency such as $$k = \frac{\pi p}{180}.$$

These are some examples of the failure signatures and it is contemplated that various failure signatures can be collected and stored in a library. The test results can be compared with the failure signatures in the library to categorize and isolate the motor faults.

As can be readily appreciated, the inventive method in the two-dimension frequency domain is more sensitive to pick up low-level failure signatures compared to the methods in the space or time domain. Furthermore, the inventive method is less affected by noise and interference, which can be easily filtered in the frequency domain. Therefore, the inventive method and apparatus can result in significant improvement in motor fault detection and isolation.

At the end of the test, all the raw data and calculated frequency responses are formatted and conveniently stored in an external storage 604 in FIG. 6, for example a USB flash drive.

A display 605 of FIG. 6, such as a touch-screen display, is further used to display results and exchange information with the user. The display 605 is connected and controlled by the computing and control unit 630 in FIG. 6.

A significant change in temperature can shift the test results. In FIG. 6 a temperature sensor 650 is connected to the computing and control unit 630, which records the temperature and saves it together with other test data.

The detailed description of the disclosure is to enable any person skilled in the art to make or use the disclosure. It is contemplated that there are various modifications of the preferred embodiment described herein, which are still within the scope of the claims of the invention. Thus, the disclosure is not limited to the preferred embodiment described herein.

REFERENCES

| U.S. PATENT DOCUMENTS | | |
| --- | --- | --- |
| 6,051,987 | April 2000 | Robert Stokes |
| 10,107,861 B1 | October 2018 | Xiaoyuan Qi |

What is claimed is:

1. An off-line method for fault detection and isolation in a rotary machine having a rotor and at least two stator windings, the rotary machine having a number of pole pairs, the method comprising the steps of:
   (a) generating, with a signal generator, an input signal and applying the input signal to a stator winding or a set of stator windings of the rotary machine while the rotor is locked at a rotor position;
   (b) measuring a current and a voltage, with an ADC and a computing and control unit, from the stator winding or the set of stator windings while the rotor is locked at the rotor position;
   (c) applying Fourier transform, with the computing and control unit, to the current and the voltage to obtain a frequency response of the stator winding or the set of stator windings at the rotor position;
   (d) rotating the rotor to a new rotor position by a rotation angle and locking the rotor at the new rotor position;
   (e) repeating the method from step (a)-(c) to obtain a new frequency response at the new rotor position;
   (f) repeating the method from step (d)-(e) till the rotor is rotated for at least a complete cycle to obtain a frequency response function of the rotation angle;
   (g) applying Fourier transform, with the computing and control unit, to the frequency response function to obtain a two-dimension frequency response in terms of a frequency and a spatial frequency;
   (h) comparing, with the computing and control unit, a magnitude or a phase difference between the two-dimension frequency response and a reference two-dimension frequency response;
   (i) determining, with the computing and control unit, that there is a fault in the rotary machine if the magnitude or the phase difference exceeds a threshold number;

(j) repeating the method from step (a)-(i) for all stator windings or all sets of stator windings.

2. The method of claim 1, wherein the input signal comprises an arbitrary waveform including a sweeping frequency waveform, an impulse waveform, a maximum length binary sequence (MLBS) waveform and other wideband waveforms.

3. The method of claim 1, wherein the rotation angle is equal to or less than 90/p degrees, wherein p represents the number of pole pairs.

4. The method of claim 1, wherein the reference two-dimension frequency response is obtained on another stator winding or another set of stator windings, or the reference two-dimension frequency response is obtained on the rotary machine in a different time period, or the reference two-dimension frequency response is obtained on a healthy rotary machine of the same model by following the method from step (a)-(g).

5. An apparatus for off-line fault detection and isolation in a rotary machine having a rotor and at least two stator windings, the rotary machine having a number of pole pairs, the apparatus comprising at least a signal generator, an ADC, and a computing and control unit to perform the functions of:
 (a) the signal generator generating an input signal and applying the input signal to a stator winding or a set of stator windings of the rotary machine while the rotor is locked at a rotor position;
 (b) the ADC and the computing and control unit measuring a current and a voltage from the stator winding or the set of stator windings while the rotor is locked at the rotor position;
 (c) the computing and control unit applying Fourier transform to the current and the voltage to obtain a frequency response of the stator winding or the set of stator windings at the rotor position;
 (d) rotating the rotor to a new position by a rotation angle and locking the rotor at the new rotor position;
 (e) repeating step (a)-(c) to obtain a new frequency response at the new rotor position;
 (f) repeating step (d)-(e) till the rotor is rotated for at least a complete cycle to obtain a frequency response function of the rotation angle;
 (g) the computing and control unit applying Fourier transform to the frequency response function to obtain a two-dimension frequency response in terms of a frequency and a spatial frequency;
 (h) the computing and control unit comparing a magnitude or a phase difference between the two-dimension frequency response and a reference two-dimension frequency response;
 (i) the computing and control unit determining that there is a fault in the rotary machine if the magnitude or the phase difference exceeds a threshold number;
 (j) repeating step (a)-(i) for all stator windings or all sets of stator windings.

6. The apparatus of claim 5, wherein the input signal comprises an arbitrary waveform including a sweeping frequency waveform, an impulse waveform, a maximum length binary sequence (MLBS) waveform and other wideband waveforms.

7. The apparatus of claim 5, wherein the rotation angle is equal to or less than 90/p degrees, wherein p represents the number of pole pairs.

8. The apparatus of claim 5, wherein the reference two-dimension frequency response is obtained on another stator winding or another set of stator windings, or the reference two-dimension frequency response is obtained on the rotary machine in a different time period, or the reference two-dimension frequency response is obtained on a healthy rotary machine of the same model by following step (a)-(g).

* * * * *